United States Patent [19]

Gastaldi et al.

[11] Patent Number: 4,847,811
[45] Date of Patent: Jul. 11, 1989

[54] PRE-CHARGING CIRCUIT FOR WORD LINES OF A MEMORY SYSTEM, IN PARTICULAR WITH PROGRAMMABLE CELLS

[75] Inventors: Roberto Gastaldi, Milan; Giulio Casagrande, Vignate, both of Italy

[73] Assignee: SGS Microelettronica S.P.A., Catania, Italy

[21] Appl. No.: 144,696

[22] Filed: Jan. 13, 1988

Related U.S. Application Data

[63] Continuation of Ser. No. 862,827, May 13, 1986, abandoned.

[30] Foreign Application Priority Data

May 14, 1985 [IT] Italy ............................... 20688 A/85

[51] Int. Cl.$^4$ ........................... G11C 7/00; G11C 8/00
[52] U.S. Cl. ................................... 365/203; 365/194; 365/233; 365/189
[58] Field of Search ................ 365/203, 189, 194, 233

[56] References Cited

U.S. PATENT DOCUMENTS

| | | | |
|---|---|---|---|
| 4,204,277 | 5/1980 | Kinoshita | 365/203 |
| 4,208,730 | 6/1980 | Dingwall et al. | 365/203 |
| 4,289,982 | 9/1981 | Smith | 365/104 |
| 4,638,459 | 1/1987 | Pechar, Jr. et al. | 365/203 |
| 4,710,900 | 12/1987 | Higuchi | 365/189 |

Primary Examiner—Terrell W. Fears
Assistant Examiner—Melissa J. Koval
Attorney, Agent, or Firm—Cushman, Darby & Cushman

[57] ABSTRACT

A voltage divider is placed between a supply terminal and ground and an intermediate node is connected to the word line to ensure a precharging voltage to the word line which is lower than the supply voltage. The voltage divider is characterized by a precharging transistor included in the voltage divider which has electrical and geometrical characteristics similar to those of the memory cells in such a manner as to adapt the precharging voltage to the characteristics of the cells.

6 Claims, 1 Drawing Sheet

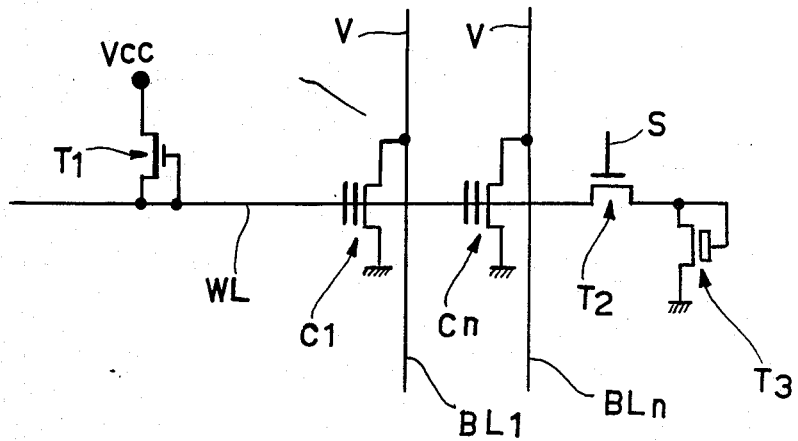

PRE-CHARGING CIRCUIT FOR WORD LINES OF A MEMORY SYSTEM, IN PARTICULAR WITH PROGRAMMABLE CELLS

This is a continuation of application Ser. No. 862,827, filed May 13, 1986, which was abandoned upon the filing hereof.

BACKGROUND OF THE INVENTION

The present invention relates to a precharging circuit for word lines of a memory system, in particular a memory system with programmable cells.

It is known that in high-density programmable memories a large part of the time necessary for reading is due to the time required to bring the selected word line to a level such as to allow the memory cell involved to conduct sufficient current to trip the sense amplifier. This is a mainly due to the long signal propagation time along the word line involved, characterized by high associated resistance and capacitance, especially if the material used for the word line is polysilicon. In particular, the access time brought about by the chip enable signal, which brings the memory system from a standby condition in which all the circuits in the system are disabled to an operational condition for reading of a datum, is long.

To reduce the access time to the memory cells, in particular in output from a standby condition, it was thought in the prior art to precharge all the word lines at the supply voltage (Vcc) of the memory during the standby phases while in the reading phase all the word lines except the directed one, which maintains high operating voltage, are grounded. In this case, before obtaining a correct reading, all the word lines except that one selected must fall below a voltage value lower than the threshhold of a virgin cell.

This solution, which is acceptable in many ways, has several drawbacks, however, especially if applied to high-density memories. Such drawbacks include the fact that (1) the current transient associated with the commutation of all the word lines can introduce noise on the grounded supply lines; (2) the capacitance which couples the substrate of the memory system and the word lines causes the substrate voltage to drop during commutation with the result that all the nodes coupled with the substrate are subject to a more or less serious disturbance; (3) the resistance of the substrate constitutes an appreciable contribution to the discharge time of the word lines when they commute all at once; indeed, the word lines can be schematized as an RC circuit in which R is equal to the parallel of the resistances of the strips of polysilicon making up the word lines plus the resistance of the substrate and of the substrate ground contact, and C is the sum of the capacitances of all the word lines to the substrate; and given the capacitance values involved (0.5 nF) the resistance of the substrate obviously cannot be overlooked; and (4) the capacitive coupling of all the word lines and of the doping strip N which makes up a bit line pushes the bit line to a negative potential in relation to ground during output of the standby phase. The PN junction (substrate) can thus be polarized directly, causing injection of minority carriers in the substrate with the danger of putting in conduction the bipolar parasites formed by bit line (N), substrate (P) and any nearby junctions N. These drawbacks have led certain manufacturers to avoid precharging the word lines, foregoing the related benefits in terms of access time.

SUMMARY OF THE INVENTION

The object of the present invention is to accomplish a precharging system for word lines of programmabale cell memories but which is also extendible to other types of memory which would assure the benefits of precharging in terms of access speed, thereby reducing to a minimum the negative effects mentioned above.

This object has been achieved by providing a precharging circuit characterized in that it comprises for each word line of the memory a voltage divider coupled between a supply terminal of the memory cell and ground, its intermediate node being connected to the word line. The voltage divider also includes between the intermediate node and ground a precharging transistor having electrical and geometrical characteristics similar to those of the memory cells. The present invention so arranged provides for supply to the word lines of the memory a precharging voltage of reduced value which limits access time of the signals while avoiding the above-mentioned drawbacks now associated with precharging systems.

Using a voltage divider with a precharging transistor having characteristics similar to those of the memory cells also avoids possible inaccuracies and uncertainties in determination of the optimal precharging voltage which are otherwise due to the broad range of variation of the cell characteristics.

BRIEF DESCRIPTION OF THE DRAWING

An example of a practical embodiment of the precharging circuit in accordance with the invention is illustrated for greater clarity in the annexed drawing of which the only FIGURE shows the details of the precharging circuit associated with a word line of a memory with a programmable cell matrix.

DETAILED DESCRIPTION OF THE PREFERRED EMBODIMENT

Referring to the drawing, C1-Cn indicate the memory cells associated with a given word line WL, each of which can be fed with voltage V through a respective bit line BL1-BLn. The word line WL constitutes the intermediate node of a voltage divider made up of a charging transistor T1 and a precharging transistor T3, the former placed between a supply terminal with voltage Vcc and the word line, and the latter placed between the word line and ground. The transistor T3 is selected in such a manner as to have electrical and geometrical characteristics similar to those of the cells C1-Cn of the memory.

A transfer transistor T2 controlled by an enabling signal S is associated with the word line WL to isolate the transistor T3 during the active cycles of the memory. In this manner, with the memory system in standby condition the word line WL is precharged at a voltage intermediate between Vcc and 0 which ensures high access speed of signals without giving rise to the drawbacks otherwise due to a high precharging voltage. The precharging voltage is selected in such a manner as to be the minimum necessary to allow a virgin cell to conduct sufficient current.

The transistor T3 has the same characteristics as the memory cell and allows the precharging voltage to vary with the parameters which influence the transconductance of the cells. If transconductance increases, that of the transistor T3 increases also and hence precharging voltage decreases and vice versa. Through the voltage divider T1, T3 dependence of precharging voltage on supply voltage variations is also reduced.

The transistor T2 isolates the word line from the precharging system during active cycles. It is controlled as already mentioned by the enabling signal S of the memory chip.

The resistance of the word line makes the precharging voltage irregular along the entire line. However, given the low currents involved, the difference is negligible.

Finally, the precharging system in accordance with the invention is adaptable to all types of sensing amplifiers used for reading memorized data but is particularly suitable in the differential type in which the memory cell current is compared with a reference cell current. In general, the gates of the two cells are supplied by the same word line for reasons of symmetry so that with this circuit the two cells are precharged at exactly the same voltage, thus improving the response of the sense amplifier.

We claim:

1. A memory cell pre-charging circuit arrangement comprising:
    an array including a plurality of memory cells integrated onto a single substrate;
    a word line coupled to more than one of said memory cells for selectively activating said memory cells; and
    a voltage divider circuit, including a pre-charging transistor, said voltage divider circuit being coupled between a voltage supply of said memory cells and a circuit ground and having an intermediate node coupled to said word line, said voltage divider circuit driving said word line during a standby cycle to a pre-charging voltage intermediate between a voltage of said supply and ground so as to minimize a delay caused by charging of the word line at the beginning of an active cycle of the memory cells, and said pre-charging transistor being coupled between said word line and said circuit ground and having similar geometric and electrical characteristics to those of said memory cells so as to avoid inaccuracies in determination of the optimal pre-charging voltage.

2. A circuit arrangement according to claim 1 wherein said voltage divider circuit further comprises a charging transistor.

3. A circuit arrangement according to claim 2 wherein said charging transistor is coupled between the voltage supply of said memory cells and said word line.

4. A circuit arrangement according to claim 2 further comprising a transfer transistor coupled between said word line and said pre-charging transistor, said transfer transistor being controllable by an enable signal coupled thereto to isolate said pre-charging transistor from said word line during active cycles of said memory cells.

5. A circuit arrangement according to claim 3 further comprising a transfer transistor coupled between said word line and said pre-charging ttansistor, said transfer transistor being controllable by an enable signal coupled thereto to isolate said pre-charging transistor from said word line during active cycles of said memory cells.

6. A memory cell pre-charging circuit arrangement comprising:
    an array including a plurality of memory cells integrated onto a single substrate;
    a word line coupled to more than one of said memory cells for selectively activating said memory cells during an active cycle of the memory cells;
    a voltage divider circuit, including a pre-charging transistor, said voltage divider circuit being coupled between a voltage supply of said memory cells and a circuit ground and having an intermediate node coupled to said word line, said voltage divider circuit driving said word line during a standby cycle to a pre-charging voltage intermediate between a voltage of said supply and ground, and said pre-charging transistor being coupled between said word line and said circuit ground and having similar geometric and electrical characteristics to those of said memory cells; and
    a transfer transistor coupled between said word line and said pre-charging transistor, said transfer transistor being controllable by an enable signal coupled thereto to isolate said pre-charging transistor from said word line during active cycles of said memory cells.

* * * * *